United States Patent

Boudry

[11] Patent Number: 5,644,254
[45] Date of Patent: Jul. 1, 1997

[54] RAPID SWITCHING INPUT-OUTPUT COUPLERS FOR HIGH RATE DATA TRANSFER BUSES

[75] Inventor: Jean-Marie Boudry, Montigny le Bretonneux, France

[73] Assignee: Bull, S.A., France

[21] Appl. No.: 595,003

[22] Filed: Jan. 31, 1996

[30] Foreign Application Priority Data

Feb. 8, 1995 [FR] France .................. 95 01457

[51] Int. Cl.$^6$ ........................... H03K 19/0185
[52] U.S. Cl. .................. 326/62; 326/27; 326/30; 326/86
[58] Field of Search ................. 326/27, 30, 62, 326/86

[56] References Cited

U.S. PATENT DOCUMENTS

| | | | |
|---|---|---|---|
| 4,877,978 | 10/1989 | Platt | 326/27 |
| 5,019,728 | 5/1991 | Sanwo et al. | 326/86 |
| 5,140,194 | 8/1992 | Okitaka | 326/86 |
| 5,341,039 | 8/1994 | Fukumoto. | |
| 5,438,281 | 8/1995 | Takahashi et al. | 326/30 X |
| 5,463,331 | 10/1995 | Kuo | 326/86 |

FOREIGN PATENT DOCUMENTS

| | | |
|---|---|---|
| 346876 | 12/1989 | European Pat. Off. . |
| 463316 | 1/1992 | European Pat. Off. . |
| 485102 | 5/1992 | European Pat. Off. . |
| 9217938 | 10/1992 | WIPO . |

OTHER PUBLICATIONS

Patent Abstracts of Japan, vol. 013 no. 386 (E-812) [3734] 25 Aug. 1989 & JP-A-01 135118 (Mitsubishi) 26 May 1989, abstract.

Patent Abstracts of Japan vol. 012 no. 124 (E-601) [2971] 16 Apr. 1988 & JP-A-62 249523 (NEC) 30 Oct. 1987, abstract.

IEEE Journal of Solid-State Circuits, vol. 28, no. 12 Dec. 1993 New York, US pp. 1370-1373 Dolle "A Dynamic Line-Termination Circuit for Multireceiver Nets" abstract; figures 1,4, p. 1370, right col., line 2 –line 3.

Proceedings of the International Conference on Computer Design, 3 Oct. 1988—5 Oct. 1988 Rye Brook, US pp. 344-347, Gabara & Thompson "High Speed, Low Power CMOS Transmitter-Receiver System" figures 1,2.

Electronic Components & Applications, 1985, Netherlands, vol. 7, No. 3, 1986 Eindhoven, NL, pp. 151-162, Volgers "Using 74HCT HCMOS to Replace LSTTL and Drive Transmission Lines" entire document.

Patent Abstracts of Japan vol. 14 No. 166 (E-911) [4109] 30 Mar. 1990 & JP-A-02 022917 (Fujitsu) 25 Jan. 1990 abstract.

Primary Examiner—David R. Hudspeth
Attorney, Agent, or Firm—Kerkam, Stowell, Kondracki & Clarke, P.C.; Edward J. Kondracki

[57] ABSTRACT

The invention relates to the field of rapid switching input-output couplers for high rate data transfer buses. The input-output coupler of an integrated circuit enables signals to be exchanged with identical couplers disposed in other integrated circuits by means of a bus line (51). Such a coupler comprises a transmitter (6) and a receiver (7) connected to a line (51) by a first conductor (5). The transmitter (6) comprises a first switch (63) whose on condition puts the first conductor (5) at a potential Vb. The coupler comprises additionally a second switch (64) or (65) whose on condition switches the first conductor (5) to a potential Vtt and arranged such that the switching on of the second switch is only possible after the switching off of the first switch (63). Accordingly, rapid switching on of the second switch (64) or (65), enables rapid variations to be obtained between two discrete states of potential Vb and Vtt of the electrical conductor connecting the transmitter to the bus line, with high stability in each of these two states.

17 Claims, 4 Drawing Sheets

RAPID SWITCHING INPUT-OUTPUT COUPLERS FOR HIGH RATE DATA TRANSFER BUSES

BACKGROUND OF THE INVENTION

1. Field of the Invention

This invention relates to the field of fast switching input-output couplers for high rate data transfer buses. The working frequencies of this type of coupler are situated in the range from 100 to 200 MHz. It is possible to utilise CMOS technology so as to favour low heat dissipation. In addition, this type of coupler is compatible with emitter coupled logic technology ("ECL"), as the working voltage is defined at 0.8 V.

2. Description of the Related Art

Several couplers of this type are connected to a common transmission line, several transmission lines connected in parallel then constituting a data transfer bus. To avoid the problems of reflections at the end of the line when a signal is transmitted by one of the couplers, a matching resistance is installed at each end of the line. However, another interference phenomenon occurs which hinders the speed of transfer. The connections of the transmitting circuit to the bus lines present an intrinsic inductance which causes transient oscillatory conditions each time the signal to be transmitted is switched. In order to avoid faulty interpretation of the signal, it is then necessary to wait for sufficient damping of the oscillations to occur before generating the next switching.

FIG. 1 shows a state of the art system in which several integrated circuits 1, 2, 3, 4 communicate with each other through the intermediary of a data bus. Such a system is not limited just to the four integrated circuits shown, and is worthwhile as soon as communication is needed between two integrated circuits. The data bus comprises at least one line 51 connecting the different integrated circuits which are to communicate with each other. To exchange n signals simultaneously between the different integrated circuits, the data bus therefore comprises n identical lines 51, each of which is assigned to a signal. For each signal exchanged with the set of other integrated circuits, an integrated circuit has an input-output coupler connected to the line 51, assigned to this signal, through a conductor 5. The coupler comprises a transmitter 6 whose output is connected to the conductor 5, and a receiver 7 whose input is connected to the same conductor 5. The signal transmitted is a binary signal having two states E1 and E0, to each of which corresponds a value of the potential of the line 51. The variations of the potential between these two values are made at high frequency. At these frequencies, the intrinsic inductance and capacitance of the line mean that the variations in potential are propagated in the form of a wave. The propagation velocity of this wave along each section of the line is a function of the inductance and the capacitance of this section, which therefore define a characteristic impedance for the section. Any variation in impedance causes a variation in the propagation velocity of the wave, which then decomposes into a transmitted wave and a reflected wave. To avoid this phenomenon, the line has a structure, and therefore a characteristic impedance Z, which are as far as possible constant over the whole of its length. The connection of a coupler to the line introduces a discontinuity. However, it is usually considered that the structure of the line remains constant over the whole of its length once the couplers are spaced uniformly apart at fixed intervals. It is then sufficient to consider as elementary section a section of the line whose length is equal to one interval. The introduction of a coupler is comparable in essence to the introduction of an additional capacity in the line, resulting in a reduction of the characteristic impedance Z and a slight increase in the propagation time. At the end of the line, one end of an impedance 56 is connected, the other end of the impedance 56 being connected to a fixed potential source Vtt provided by a node 50. The value of the impedance 56 being equal to the characteristic impedance of the line, this enables the echo phenomena to be avoided which are caused by reflection at the end of the line. It follows that, in the absence of transmitted signals, the line 51 is maintained uniformly at the reference potential of the node 50 through the impedance 56.

The transmitter 6 comprises a switch 63 connected between the conductor 5 and a potential source Vn provided by a node 51. This switch is controlled by a circuit 62. Essentially, this circuit receives two signals e and i from a logic unit 8 situated in the same integrated circuit as the transmitter 6. For example, the logic level 1 of the signal e represents an authorisation to transmit for the transmitter 6 and the logic level 1 of the signal i represents the state E1 of the signal to be transmitted. The conjunction of the signals e and i switches the switch 63 on. At any given moment, the authorisation to transmit is limited to a single integrated circuit and no other integrated circuit can transmit on the line 51.

In the integrated circuit which receives the authorisation to transmit, when the signal i is at zero representing the state E0 of the signal to be transmitted, the switch 63 is off. The value of the potential of the conductor 5 is equal to the potential Vtt of the node 50. The signal i switching to 1, representing the state E1 of the signal to be transmitted, switches the switch 63 on. When the switch 63 is on, it presents its own characteristic impedance R3. Thus the on state of the switch 63 causes a current I to appear in the conductor 5 which places the conductor at a potential value Vb whose difference from the potential Vn is equal to the product of the impedance R3 multiplied by the current I. The characteristic impedance of the switch 63 is usually small compared to the characteristic impedance Z of the line, so that the potential Vb is close to the potential Vn of the node 61. The potential Vb of the conductor 5 then propagates along the line 51, towards the couplers of the other integrated circuits connected to the same line 51. Then, the signal i switching to 0, representing the state E0 of the signal to be transmitted, switches the switch 63 off. The known properties of a switch are that when it is off, its characteristic impedance has an infinite resistive component and a slightly capacitive reactive component. Accordingly, the off state of the switch 63 prevents the current I flowing in the conductor 5 and takes the conductor to a value of potential higher than Vb to cancel the current I. The increase of potential of the conductor 5 is then propagated along the line 51 towards the couplers of the other integrated circuits connected to the same line 51.

Each coupler comprises a receiver 7 consisting essentially of a differential amplifier 72. The negative input of the differential amplifier 72 is connected to the conductor 5 and the positive input is connected to a potential source Vref provided by a node 71. The output of the differential amplifier 72 sends a signal s to the logic unit 8 of the integrated circuit to which the coupler belongs. The value of the potential Vref is included between the values Vb and Vtt. For example, if Vtt=1.2 V, Vb=0.4 V, it is possible to have Vref=0.8 V. Accordingly, if the potential of the conductor 5 is close to Vtt, its value greater than the potential Vref switches the differential amplifier 72 to negative saturation, generating a signal s at the logic level 0. If the potential of the conductor 5 is close to Vb, its value lower than the potential Vref takes the amplifier 72 to positive saturation, generating a signal s at the logic level 1.

Thus, each receiver 7 transmits a signal s at level 1 to the logic unit 8 of the integrated circuit to which it belongs when the potential of the conductor 5 connecting to the line 51 is at Vb, that is to say when the state E1 of a signal is transmitted on this line. For example, the receiver 7 transmits a signal s at 0 to the logic unit 8 of the integrated circuit to which it belongs when the potential of the conductor 5 connecting it to the line 51 is at Vtt, that is to say when the state E0 of a signal is transmitted on this line or in the absence of any transmitted signal, which is identical to the state E0.

As we have seen above, the impedance 56 installed at the end of the line with a value equal to the characteristic impedance of the line enables echo phenomena to be avoided. It is therefore not necessary to await the damping of the echo on the line following a change of state of the transmitted signal in order to evaluate the new state. Once the evaluation of the new state is made, a new change of state can then be transmitted if necessary. The absence of any reflected wave from the end of the line is promising regarding the speed of exchange of signals between the different couplers. For example, it might be thought possible not to wait for the voltage wave, related to the change of state, to have reached the end of the line in order to transmit after it a voltage wave related to a fresh change of state of the signal. If sufficiently fast switches are available, it might even be possible to contemplate frequencies of variation of the signals so high that the line 51 would not necessarily be equipotential, but would merely have a defined potential at the point where the signal is evaluated.

However, it has been noted that the voltage wave which propagates along the line 51 from the coupler which transmits the signal does not consist of a perfect step which ideally would be produced by opening and closing of the switch 63. Oscillatory waves are observed which are superimposed upon the perfect step wave, representative of the signal to be transmitted. These oscillatory waves, of transient nature, are damped by the matching impedance at the end of the line. However, it often happens that the amplitude of these waves exceeds the high and low detection thresholds of the receiver 7 connected to the line. It then becomes necessary to await sufficient damping of the oscillations to make a correct evaluation of the signal. It sometimes happens that this waiting time is of a comparable order of magnitude to, or perhaps even greater than, the time required for the voltage waves to reach the end of the line. This observation dashes the hopes of rapidity which cancelling the echo from the end of the line promised.

The problem which is posed for increasing the speed of transfer of signals between the different integrated circuits is to reduce interfering oscillations to the extent that they are practically eliminated. Now, the disadvantage mentioned above is attributed to limits which are inherent in the switching of the switch 63 of the transmitter. In fact, the conductor 5 of each coupler cannot be physically perfect. The physical connection of the coupler, integrated within the circuit whose signal it transmits, to the line 51 which is external to the circuit, gives the conductor 5 an inductance which however low it may be, nonetheless makes its presence felt on the variations of current flowing. In addition, the amplifier 72 of the receiver 7 has an input capacity connected to the conductor 5 which then constitutes an oscillatory circuit.

One solution would be to eliminate the interferences caused by the oscillatory circuit mentioned above at their source by making the conductor 5 or the switch 63 of sufficiently high resistance to create a damping coefficient. This solution is unsatisfactory since it would reduce the pass band of the coupler and induce a Joule effect producing heat in the circuit. In addition, the oscillatory nature of the conductor 5 is not limited only to the coupler which is transmitting but also makes its presence felt at each coupler which receives the signal. Now, if the conductor 5 were resistive, its connection to the line 51 would cause a discontinuity in the impedance of the line induced by the current-voltage wave splitting between the conductor 5 and the line down stream. Also, the conductor 5 of a coupler which is receiving behaves like a capacity in series with an inductance and therefore forms an oscillatory circuit. A modification of the voltage wave in the conductor 5 of the receiver would be likely to be sent back onto the line, thus producing noise.

Another solution would be to provide an impedance for matching to the line 51 at the conductor 5 of the receiving coupler to avoid any retransmission of the wave onto the line from the receiver. However, the presence of a matching resistance at a point other than the end of the line presents a disadvantage for the wave representing the signal. In fact the matching resistance reduces the transmission of the wave beyond the point where it is positioned on the line. It then becomes problematical to install a receiver beyond the first receiver without attenuation of the transmitted wave. This is why this solution is adopted, according to the state of the art, in the form of a link called a series link, where only two transmitter-receiver couplers exchange their signals on one line, each coupler being positioned at the end of the line. In order for an integrated circuit to communicate with a plurality of other integrated circuits, it is then necessary to provide a plurality of transmission lines with a coupler dedicated to the line in each case. Among others, this has the disadvantage of multiplying the number of links between integrated circuits and of requiring it to be defined which of the integrated circuits are to communicate with which others at the time of design of the overall electrical circuit into which these circuits will be incorporated. Clever architecture enables the number of links to be optimised, but degrades the system physically produced in its original design. In spite of all the power of the software it is not possible to develop such a system to make two integrated circuits communicate directly by later creating links which were not produced initially.

OBJECTS OF THE INVENTION

The object of the invention is to provide a coupler adapted for a large number of them to be connected to the same high rate transmission line. A signal is transmitted at high rate by the succession of rapid variations between the two discrete states Vb and Vtt of the potential of the line. A correct interpretation of the signal requires a great stability of each of these two states.

SUMMARY OF THE INVENTION

The solution of the invention is an input-output coupler for an integrated circuit, for exchanging signals with at least two identical couplers of other integrated circuits through a bus line, comprising a transmitter and a receiver connected to the line through an electrical conductor, the transmitter comprising a first switch whose on condition, of low impedance, brings the conductor to a potential Vb, characterised in that it comprises at least a second switch whose on condition takes the conductor to a potential Vtt and such that the switching on of the second switch is only possible after the first switch has been switched off.

Thus the off state of the first switch, before the second switch is switched on, avoids the electrical conductor being put at an intermediate potential by the simultaneous switching on of both switches, and ensures that the electrical conductor has two distinct potential states Vb and Vtt.

Switching the potential state from Vb to Vtt is all the faster the shorter the lead time separating the switching on of the second switch after the switching off of the first switch.

To this end, the invention provides as second switch a switch that is switched on immediately when the potential of the electrical conductor passes a threshold beyond the potential Vtt. An additional advantage is gained if the electrical conductivity of the second switch when switched on increases with the potential of the electrical conductor.

Accordingly, the rapid switching on of the second switch, with a high level of conduction, governed only by the requirement that the first switch be off, enables the combination of two features to be obtained which a priori are difficult to reconcile, a first feature of rapid variations being possible between two discrete states of potential Vb and Vtt of the electrical conductor connecting the transmitter to the bus line, and a second feature of high stability in each of these two states.

The invention also provides that the second switch is switched on with an infinitesimal delay after the first switch is switched off.

Here again, the rapid switching on of the second switch, governed only by the requirement that the first switch should be off, enables the combination of two features to be obtained which a priori are difficult to reconcile, a first feature of rapid variations being possible between two discrete states of potential Vb and Vtt of the electrical conductor connecting the transmitter to the bus line, and a second feature of high stability in each of these two states.

When the data bus is formed of a plurality of lines in parallel, each integrated circuit connected to this bus comprises an input-output coupler for each line. At each end of each line there is a matching impedance in the form of a component external to the integrated circuits. These matching impedances take up a troublesome amount of room in the printed circuit on which the integrated circuits are installed.

An additional application of the invention enables the connection of the matching impedances in the form of components external to the integrated circuits to be avoided. To this end the input-output coupler comprises an impedance switch connected between the first electrical conductor and the second electrical conductor at the potential Vtt, whose impedance is equal to the characteristic impedance of the line, this switch being on when the coupler is situated at one end of the line, in a non transmitting mode.

DESCRIPTION OF THE DRAWINGS

These embodiments, and other features and advantages of the invention will appear from the continuation of the description with reference to the drawings.

DESCRIPTION OF THE PREFERRED EMBODIMENTS

Figure 1:
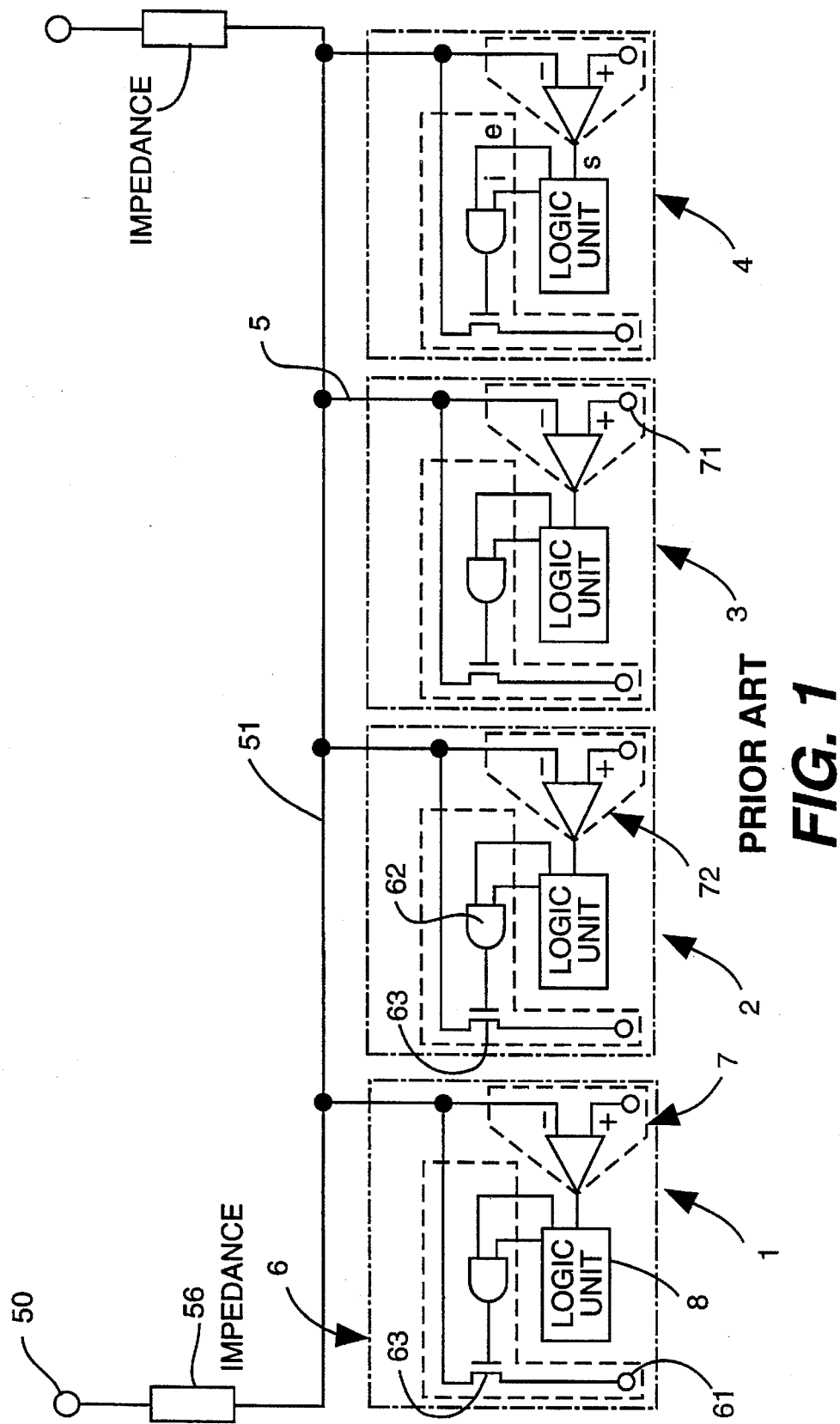
FIG. 1 is a schematic diagram of an electrical circuit and illustrates the context to which the invention can be applied.

As seen above, FIG. 1 shows an electrical circuit which does not benefit from the advantages of the invention. For example, assuming that the coupler of the circuit 2 is in the transmission mode and that the couplers of the other circuits 1, 3, and 4, by way of example, are in non transmitting mode. The line 51 has two stable states of potential. The first state corresponds to the absence of current flowing in the line which puts the line at the potential Vtt of the node 50. The second state corresponds to a current flowing, generated by the coupler 2, which puts the line at the potential Vb close to the potential of the node 61. For each stable state of the line 51, the conductor 5 of any one coupler is at the same potential as the line 51. Since the line 51 is initially in the first state, the input capacities of the amplifier 72 of each coupler are charged to the potential Vtt. The closure of the switch 63 of the coupler of the circuit 2 causes a current to flow in the conductor 5 of this coupler which discharges the input capacities of the amplifier 72 and lowers the potential of the point where the conductor 5 is connected to the line 51 towards the value Vn provided by the node 61. This drop of potential creates a falling edge which is propagated on the line 51, in the form of a current-voltage step wave towards the coupler of the circuit 1 and towards the couplers of the circuits 3 and 4. As it passes the point where the line 51 is connected to the conductor 5 of the coupler of each of the other circuits, the step in voltage discharges the input capacity of the amplifier 72 of the coupler of the relevant circuit towards the line 51. When it arrives at the end of the line, the step in voltage causes current to flow in the impedance 56 which corresponds to the step in current, since the impedance 56 is matched to the characteristic impedance of the line.

Figure 2:
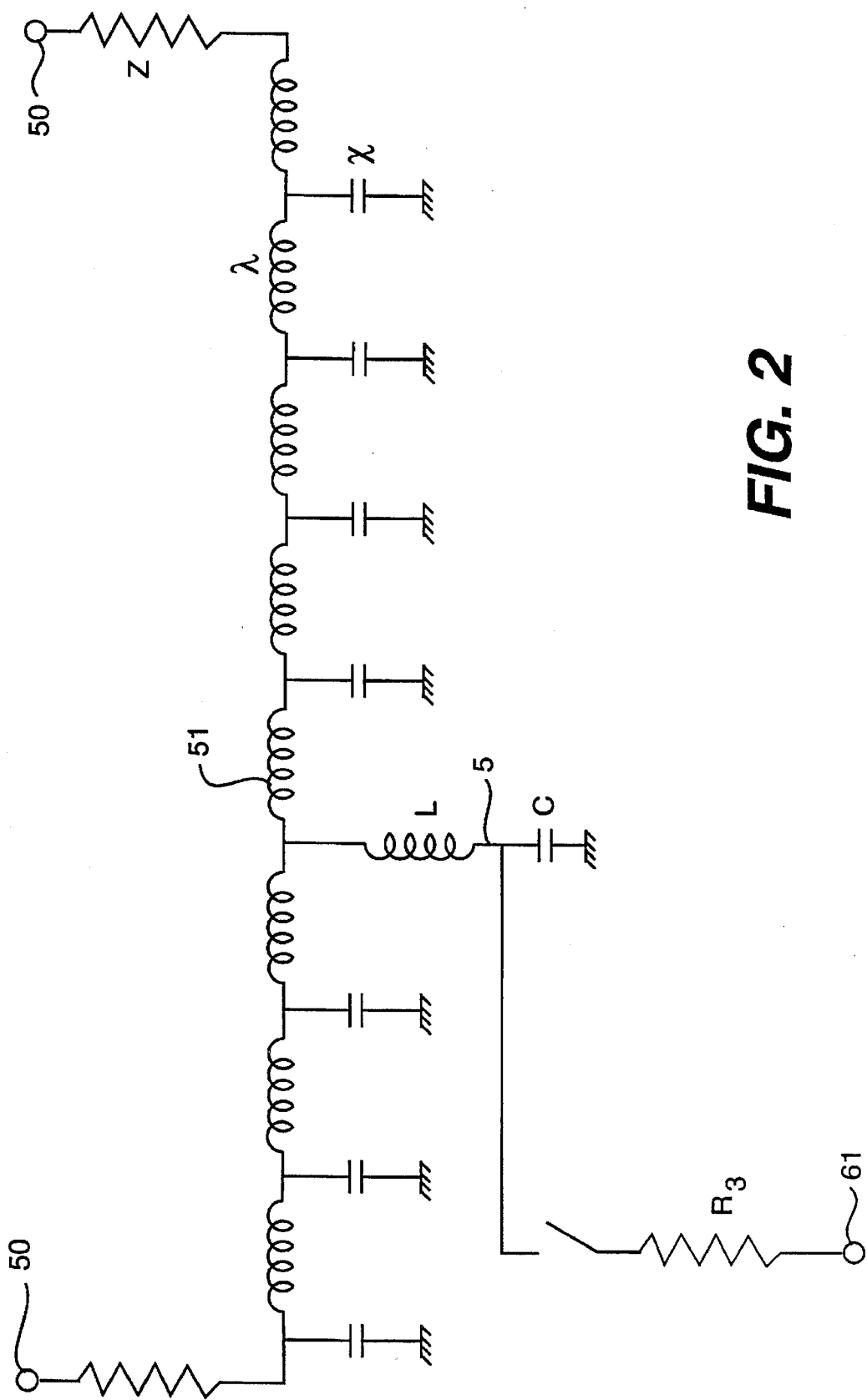
FIG. 2 shows a functional model of a circuit for high rate information exchange.

FIG. 2 shows a functional model of a circuit for high rate information exchange. The line 51 behaves at high frequency like a series connection of infinitesimal dipoles of specific linear inductance $\lambda$ and of specific linear capacitance $\chi$, which define the characteristic impedance Z of the line. The connection of the conductor 5 to the line 51 has an inductance L. The connection of the conductor 5 to the amplifier 72 has a capacity C. The switch 63 is modelled in the form of a perfect switch plus a resistance R3 which is just exactly the resistance of the switch 63 when switched on. The resistance R3 has a low value; for example, if Vn=0 V, Vtt=1.2 V and R3=Z/10, we obtain Vb=0.2 V. Referring still to the coupler of the circuit 2 in transmission mode, the potential of the conductor 5 being at the value Vb, the sudden opening of the switch 63 prevents the established current in the conductor 5 from flowing. However, the connection inductance L of the conductor 5 to the line 51 tends to maintain this current which then goes to charge up the input capacity C of the amplifier 72. The potential of the conductor 5 rises towards a value Vh such as to cancel the current in the connection inductance. This value Vh depends only on the input capacity C and on the connection inductance L which constitute the physical parameters of the circuit. According to these parameters, the value Vh is lower, or respectively higher, than the value Vtt, for example according to whether the input capacity C is large, or respectively negligible, compared to the connection inductance L. As it is difficult to master the value of these parameters, which are inherent in the hardware configuration of the circuit, the opening of the switch 63 has every chance of transmitting transient values of potential to the line 51 which do not correspond to either of the two stable states Vb nor Vtt. These transient values introduce a corresponding delay before the moment when a correct evaluation of the transmitted signal can be achieved.

In addition, concerning a coupler in non transmission mode, a positive step on the line 51 causes current to flow in the connection inductance L of this coupler to charge up the input capacity C of its amplifier 72 to a new voltage value. Now, the connection inductance L causes an overshoot in the value of the voltage step at the position of the receiving coupler, which is a source of additional transient phenomena on the line 51. A multitude of transient voltage waves are then seen to appear on the line 51 of the circuit of FIG. 1, whose superimposition at certain points is liable to introduce contradictions in the interpretation of the signal to be transmitted.

Figure 3:
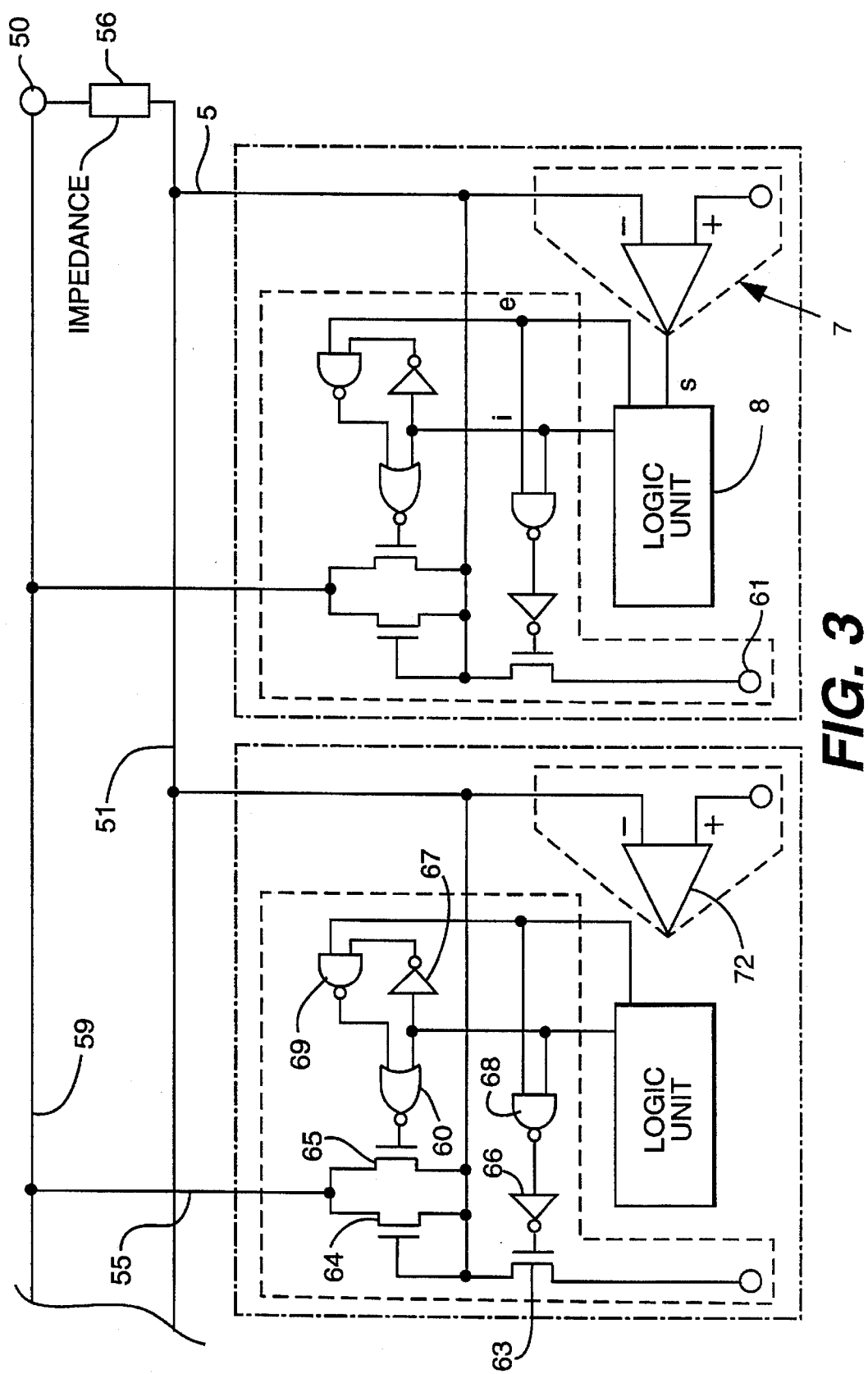
FIG. 3 illustrates the first distinctive features of the invention.

FIG. 3 is a partial view of a circuit illustrating various improvements which enable the disadvantages mentioned above to be avoided. For the sake of clarity, only two couplers connected to a single line 51 have been shown. The line 51 extends implicitly to the left where other couplers may be connected. Such couplers are assigned to different logic units 8 which are adapted to communicate with each other. Within each coupler, at least one switch 64, 65 is connected between the conductor 5 and a conductor 55. This conductor 55 is connected to a supply bus 59 which forms a source of potential Vtt due to its connection to the node 50. FIG. 3 shows an example of an embodiment of the circuits in CMOS technology. Thus, the switch 64 is formed by means of an MOS transistor whose drain and source are connected respectively to the conductor 55 and to the conductor 5, and whose gate is connected to the conductor 5. The switch 65 is formed by means of an MOS transistor of low resistance whose drain and source are connected respectively to the conductor 55 and to the conductor 5, and whose gate is connected to a block consisting of logic elements 60, 67 and 69.

The switch 64 is switched on as soon as, and as long as, the potential of the conductor 5 exceeds the potential of the conductor 55 by a threshold voltage. In the example of forming the switch 64 from an MOS transistor, this threshold voltage is of the order of 0.6 V. Now, the switch 63 has a low resistance in the on condition. In the on condition of the switch 63, the potential of the conductor 5 is therefore at a value Vb, close to the potential Vn of the node 61, and substantially lower than the potential of the conductor 55, the latter being close to the potential Vtt of the node 50. Accordingly, only the switch 63 being switched off enables the value of the potential of the conductor 5 to be higher than that of the potential of the conductor 55, and therefore enabling the switch 64 to be switched on. This avoids simultaneous conduction of the switch 63 and the switch 64 creating a short-circuit between the potential Vtt and Vn due to the low resistance of the switches, which would hence produce unacceptable heating of the circuit or interference from a current peak. The low resistance value which is accordingly possible for the switches 63 and 64 enables the coefficient of damping for rapid variations of the potential of the conductor 5 to be reduced. When the switch 63 leaves the on condition to reach the off condition, the current maintained by the connection inductance L charges the capacity C at the input of the amplifier 72. For certain values of L/C relative to $Z^2/4$, the potential of the conductor 5 overshoots the potential Vtt of the voltage source by more than the threshold voltage. This event switches the switch 64 on. In the example of FIG. 3, the switch 64 is formed by means of an MOS transistor whose gate and source are at the potential of the conductor 5, and whose drain is connected to the conductor 55 at the potential Vtt. An overshoot of the voltage of the conductor 5 above the potential Vtt, by a value equal to the threshold voltage Vs of the transistor, switches it on with a resistance R4 which gets progressively smaller as the potential of the conductor 5 increases. For this reason, the potential of the conductor 5 is limited to a value Vtt+Vs+R4* I4, where I4 is the current flowing through the switch 64. The switch 64 switches off again when the potential of the conductor 5 is lower than Vtt+Vs. Accordingly, it is ensured that the next alternation of the potential of the conductor 5 will not drop below Vtt−Vs. Since the amplitude of the oscillations is limited to Vs, it is more rapidly damped by the characteristic impedance of the line to a value lower than (Vtt−Vref). The conductor 5 reaching a potential included between Vref and Vtt accordingly corresponds rapidly to a stable detected state. The rapid switching on of the switch 6, with a high level of conduction, governed only by the requirement that the switch 63 should be off, enables the combination of two features to be obtained which a priori are difficult to reconcile, a first feature of rapid variations being possible between two discrete states of potential Vb and Vtt of the electrical conductor connecting the transmitter to the bus line, and a second feature of high stability in each of these two states. These two features are illustrated for operation of the coupler in transmission mode, but are advantageous also for its operation in reception mode. Thus, any unwanted overshoot of the voltage of the conductor 5 beyond (Vtt+Vs) is limited to this value.

The command for the on condition of the switch 63 is at constant gate voltage, for example 0.8 V. Its low resistance is obtained by a large width of the drain-source channel. This makes the size of the switch 63 large, which takes up room in the integrated circuit. On the other hand, the avalanche effect produced in the switch 64 by the connection of the transistor gate to its source gives high conduction for a very much smaller size than that of the transistor 63.

The co-ordination of the on and off states of the switches 63 and 65 functions in the following way. When the transmission authorisation signal e is at zero, the outputs of gates 68 and 69 are at 1, which means that the outputs of the gates 60 and 66 are at zero, thus causing the switches 63 and 65 to be switched off. The potential of the conductor 5 only depends on that of the line 51. The transmission authorisation signal e is defined in such way that at every moment it can only be at level 1 for at most one coupler out of the couplers connected to the same line 51. Taking a coupler for which the transmission authorisation signal e switches to 1, the transmission authorisation signal e of the other couplers have previously been set at zero in accordance with a logic for the distribution of transmission authorisations which does not form an integral part of the invention. The potential of the conductor 5 of the relevant coupler is normally at the potential Vtt distributed along the line 51. A transmission signal i can only be switched to 1 by the logic unit 8 after the signal e has been set to 1 by the same logic unit 8. When the signal e switches to 1, the signal i is still at zero. The output of the gate 67 is still at 1 and the output of the gate 69 switches to zero although the output of gate 68 remains at 1. The output of the gate 60 switches to 1 whereas the output of the gate 66 remains at 0. The switch 65 is switched on whereas the switch 63 remains off. The potential of the conductor 5 is maintained at the potential Vtt. When the signal i switches to 1, the output of the gate 60 switches to zero with a short delay Δt corresponding to the response time of this gate and the output of the gate 66 switches to 1 with a short delay Δt' corresponding to the response time of this gate to which a second delay Δt corresponding to the response time of the gate 68 is added. In this way, the switch 63 is switched on with a delay Δt', corresponding to the response time of the gate 66 after the switch 65 has been switched off. The on condition of the switch 63 pulls the potential of the conductor 5 towards the potential Vn of the node 61. The resistance R3 of the switch 63 is low, so as to discharge rapidly the input capacity C of the amplifier 72. The opposite end of the conductor 5 to the switch 63 is connected to the line 51 which behaves as a source of voltage Vtt of internal impedance Z/2, equal to the characteristic impedance of the line. The potential of the conductor 5 ultimately stabilises at a value Vb which is higher than Vn by a proportion (R3/(R3+Z/2)) of (Vtt−Vn). When the signal i switches to zero, the output of the gate 66 switches to zero with the same delay Δt+Δt' with which it switched from zero to 1. On the other hand, the gate 69 switches to zero after a short delay Δt corresponding to the response time of this gate to which is added a delay Δt' corresponding to the response time of the gate 67. Accordingly, the gate 60 switches to 1 with a delay Δt corresponding to the response time of this gate to which is added the delay Δt+Δt'. In this way, the switch 65 is switched on with a delay Δt, corresponding to the response time of the gate 60, after the switch 63 has been switched off. The on condition of the switch 65 pulls the potential of the conductor 5 towards the potential Vtt of the bus 59.

Accordingly, the gate 66 introduces a delay Δt' before the switch 63 is switched on after the switch 65 has been switched off and the gate 67 introduces a delay Δt before the switch 65 is switched on after the switch 63 is switched off. These low values of the delays Δt' and Δt enable rapid switching on and off of the switches 63 and 65 while ensuring that the two switches cannot be simultaneously switched on. The absence of simultaneous conduction of the switch 63 and the switch 65 makes possible low values of resistance both for the switches 63 and 65 and for the conductors 5 and 55 without any risk of creating a short circuit between the potentials Vtt and Vn. The risks are thus avoided of causing unacceptable heating of the circuit or of producing interference by a current peak. These low values of resistance give a low coefficient of damping in the conductor 5, which enables rapid variations in potential.

However, the appropriate value of the on resistance of the switch 65 is of the order of ten times bigger than that of the switch 63. In this respect, the energy accumulated in the line 51 brings the potential of the conductor 5 naturally towards the value Vtt when the switch 63 is switched off. The switch 65 functions essentially to "hook" the potential of the conductor 5 onto the value Vtt. In the specific example of FIG. 3, the switches 63 and 65 are formed by means of MOS transistors which are switched on by a gate voltage of the order of 0.8 V, supplied respectively by the logic gates 66 and 60. In this conduction mode, the resistance of a transistor is inversely proportional to the width of its drain-source channel. The dimensions of the switch 65 may therefore be very much smaller than that of the switch 63, which reduces the room taken up by the coupler in the integrated circuit correspondingly. In accordance with the known characteristics of MOS transistors, the resistance R5 of the switch 65 tends to increase with the voltage at its terminals. The beneficial result of this is to damp the oscillations which make the potential of the conductor 5 different from the value Vtt. Accordingly, the potential of the conductor 5 stabilises rapidly at the value Vtt imposed by the conductor 55. The rapid switching on of the switch 65, governed only by the requirement that the switch 63 be off, enables the combination of two features to be obtained which a priori are difficult to reconcile, a first feature of rapid variations being possible between two discrete states of potential Vb and Vtt of the conductor 5, and a second feature of high stability in each of these two states. The use of the switch 65 is particularly appropriate when the potential of the conductor 5, after the switch 63 has been switched off, is slower to reach the potential Vtt of the voltage source than in the critical regime, which corresponds to values of L/C which are low compared to $Z^2/4$.

The combination of the two features of rapid variations being possible between two discrete states of potential Vb and Vtt for the conductor 5, and of high stability in each of these two states presents an advantage which is useful for transmitting high frequency signals over a distance. These signals are at two logic states E0 and E1 generated respectively by switching on and switching off a switch 63. As we have seen above, these features can be obtained by rapid switching on of a switch 64 or 65, with a high conduction level, governed only by the requirement that the switch 63 should be off. In accordance with the invention, switching on a switch 64 or 65 imposes the potential Vtt on the conductor 5, whereas switching on the switch 63 imposes the potential Vb on the conductor 5.

Depending on the value of the physical parameters of the circuit (characteristic inductance, capacity or impedance), the use of the switch 64 alone or of the switch 65 alone is sufficient. If for various reasons, such as manufacturing dispersion or drift under conditions of use, it is not possible to be certain of the value of these parameters, it is still possible to use the combination of switches 64 and 65 connected in parallel. In this way, following the off condition of the switch 63, the on condition of the switch 64 damps the oscillations produced before the switch 65 is switched on. Subsequently, the on condition of the switch 65 damps the residual oscillations.

It should be noted that the switches 63 to 65 are of the kind which are off in the absence of a command, for example formed exclusively using NMOS transistors. This ensures that in the absence of a command for the switches, the state of the conductor 5 of a coupler only depends on the state of its point of connection to the line 51. This type of switch therefore reduces the risk of interference on the line 51 from a coupler whose integrated circuit in which it is incorporated had a defective supply.

Figure 4:
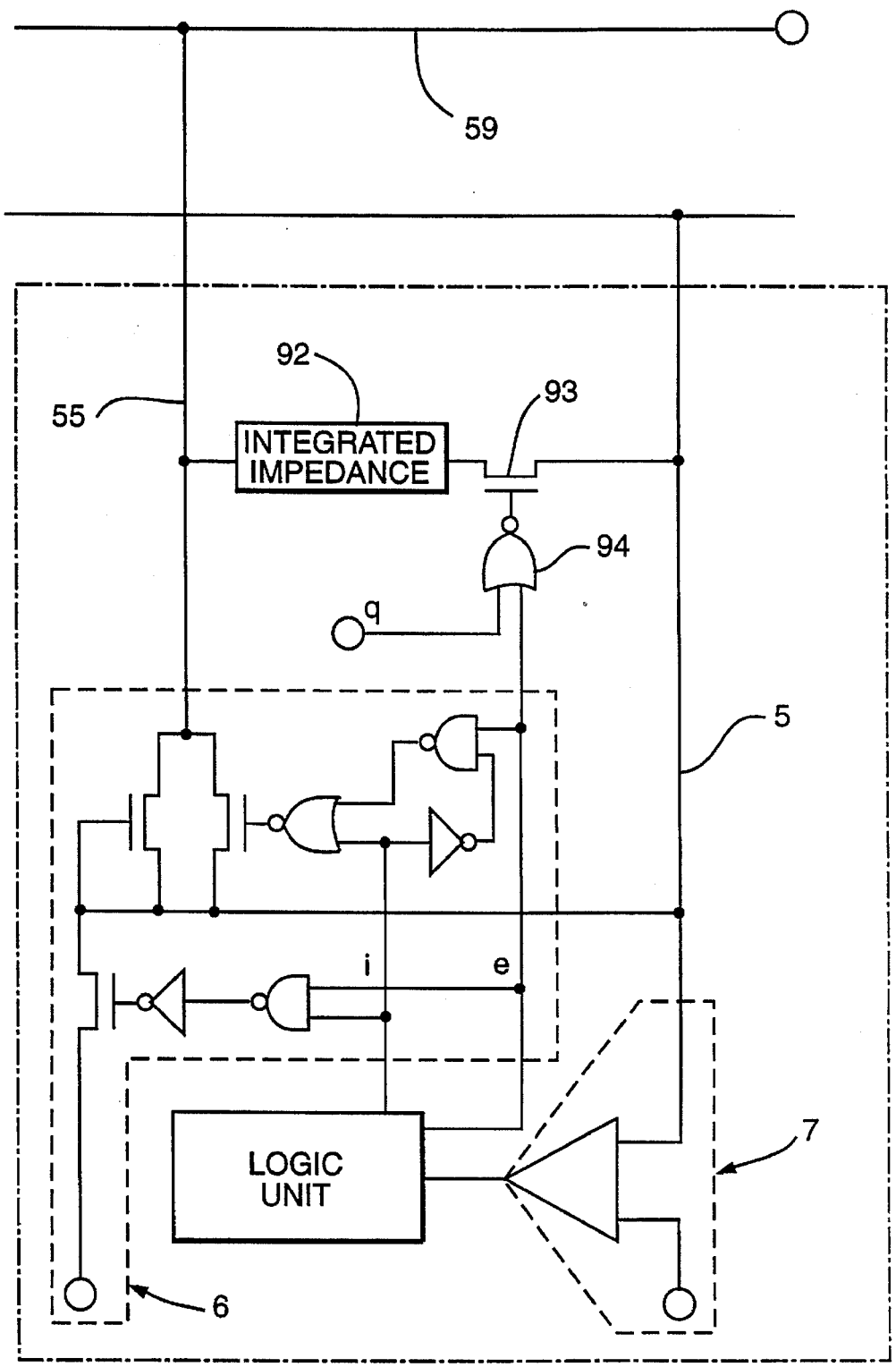
FIG. 4 illustrates the additional distinctive features of the invention.

FIG. 4 shows an impedance switch, connected between the conductor 5 and the conductor 55. This switch consists, for example, of an integrated impedance 92 and a MOS transistor 93 whose gate is controlled by a logic element 94. The value of the impedance 92 is such that the impedance of the switch thus formed is matched to the characteristic impedance Z of the line for a coupler positioned at the end of the line. The logic element 94 is a NOR gate receiving the transmission authorisation signal e as input and a binary signal q which is at zero when the coupler is positioned at the end of the line. The zero condition of the signal q can be obtained for example by means of a jumper plugged in outside the integrated circuit. Accordingly, for a coupler positioned at the end of the line, when the transmission authorisation signal e is at zero, the MOS transistor forms an on switch which connects the conductor 5 to the potential of the node 50 through the conductor 55, the supply bus 59 and the impedance 92. Such a coupler, in non transmitting mode, accordingly behaves relative to the line 51 like the matching impedance 56, as it was embodied in the previous figures. It is no longer necessary to connect matching impedances in the form of components external to the integrated circuits. When the transmission authorisation signal e is at level 1, the MOS transistor constitutes an off switch between the conductor 5 and the conductor 55. In the transmission mode, a coupler disposed at the end of the line is only subjected to the effect of the matching impedance positioned at the other end of the line. Accordingly, when the switch 63 is being switched on, the current-voltage wave being established in the conductor 5 is entirely transmitted along the line 51 towards the other couplers. The leading edge of this wave is not damped by the presence of any matching impedance. For a coupler which is not disposed at the end of the line, the signal q is at 1, and the transistor 93 is switched off. The leading edge of the current-voltage wave splits into two equal values going towards both ends of the line 51.

I claim:

1. An input-output coupler for an integrated circuit, for exchanging signals with at least two identical couplers of other integrated circuits through a bus line (51) having a characteristic impedance, comprising a transmitter (6) and a receiver (7) connected to the bus line (51) through a first conductor (5), the transmitter (6) comprising a first switch (63) having an on and an off condition, said first switch (63) in said on condition adapted to take the first conductor (5) to a potential Vb and in said off condition adapted to take said first conductor (5) to a potential different than Vb propagated along said bus line (51), at least one second switch (64), (65) having an on and an off condition, said second switch in the on condition adapted to take the first conductor (5) to a potential Vtt, and said second switch being so constructed and arranged such that switching on of the second switch (64), (65) is only possible after the first switch (63) has been switched to the off condition.

2. An input-output coupler according to claim 1, characterized in that the second switch (64) is switched to the on condition when the potential of the first conductor (5) exceeds a threshold beyond the potential Vtt.

3. An input-output coupler according to claim 1, including means for generating a first command for switching on the second switch (65), means for generating a second command for blocking said first command and for switching said first switch (63) to its on condition, and means for unblocking said first command after an infinitesimal delay when the first switch (63) is switched to an off condition.

4. An input-output coupler according to claim 3, including means for generating a first command for switching on the first switch (63), means for generating a second command for blocking said first command and for switching on the second switch (65), and means for unblocking said first command after an infinitesimal delay when the second switch (65) is switched to an off condition.

5. An input-output coupler according to claim 3, further comprising a logic gate for providing the infinitesimal delay after the first switch (63) is switched to an off condition.

6. An input-output coupler according to claim 4, further comprising a logic gate (66) for providing the infinitesimal delay after the first switch (63) is switched to the off condition.

7. An input-output coupler according to claim 1, further comprising a second conductor (55) and an impedance switch (92, 93), connected between the first conductor (5) and second conductor (55), said impedance switch having an on and an off condition and an impedance equal to the characteristic impedance of the bus line (51), the impedance switch being in an on condition when the coupler is situated at one of the ends of the bus line (51) in a non-transmission mode.

8. An input-output coupler according to claim 2, characterized in when the second switch (64) is in the on condition, electrical conductivity of the second switch increases with the potential of the first conductor (5).

9. An input-output coupler according to claim 2, characterized in that the second switch (64) comprises an MOS transistor having a drain connected to a second conductor (55) at a potential Vtt and a gate and source connected to the first conductor (5).

10. An input-output coupler according to claim 7, characterized in that the impedance switch (92, 93) comprises MOS transistors.

11. An input-output coupler according to claim 3, characterized in that the second switch (64) comprises an MOS transistor having a drain connected to a second conductor (55) at a potential Vtt and a gate and source connected to the first conductor (5).

12. An input-output coupler according to claim 4, characterized in that the second switch (64) comprises an MOS transistor having a drain connected to a second conductor (55) at a potential Vtt and a gate and source connected to the first conductor (5).

13. An input-output coupler according to claim 5, characterized in that the second switch (64) comprises an MOS transistor having a drain connected to a second conductor (55) at a potential Vtt and a gate and source connected to the first conductor (5).

14. An input-output coupler according to claim 6, characterized in that the second switch (64) comprises an MOS transistor having a drain connected to a second conductor (55) at a potential Vtt and a gate and source connected to the first conductor (5).

15. An input-output coupler according to claim 7, characterized in that the second switch (64) comprises an MOS transistor having a drain connected to a second conductor (55) at a potential Vtt and a gate and source connected to the first conductor (5).

16. An input-output coupler according to claim 8, characterized in that the second switch (64) comprises an MOS transistor having a drain connected to a second conductor (55) at a potential Vtt and a gate and source connected to the first conductor (5).

17. An input-output coupler according to claim 10, characterized in that the second switch (64) comprises an MOS transistor having a drain connected to a second conductor (55) at a potential Vtt and a gate and source connected to the first conductor (5).

* * * * *